United States Patent
Dasari et al.

(10) Patent No.: US 7,482,834 B2
(45) Date of Patent: Jan. 27, 2009

(54) PROGRAMMABLE MULTIPLEXER

(75) Inventors: Ajithkumar V. Dasari, Cupertino, CA (US); Wilma Waiman Shiao, San Jose, CA (US); Tarachand G. Pagarani, Santa Clara, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 49 days.

(21) Appl. No.: 11/551,201

(22) Filed: Oct. 19, 2006

(65) Prior Publication Data
US 2008/0094103 A1 Apr. 24, 2008

(51) Int. Cl.
*G06F 7/38* (2006.01)
*H03K 19/177* (2006.01)

(52) U.S. Cl. ............... 326/40; 326/38; 326/46
(58) Field of Classification Search ............. 326/38–41, 326/46; 327/74, 407–410
See application file for complete search history.

(56) References Cited

U.S. PATENT DOCUMENTS

| | | | |
|---|---|---|---|
| 5,327,024 A | 7/1994 | Cox | |
| 5,424,655 A | 6/1995 | Chua | |
| 5,477,165 A * | 12/1995 | ElAyat et al. | 326/38 |
| 5,477,167 A | 12/1995 | Chua | |
| 5,825,201 A | 10/1998 | Kolze | |
| 6,111,437 A * | 8/2000 | Patel | 327/74 |
| 6,292,019 B1 * | 9/2001 | New et al. | 326/41 |
| 6,426,649 B1 | 7/2002 | Fu et al. | |
| 6,483,343 B1 | 11/2002 | Faith et al. | |
| 6,519,753 B1 | 2/2003 | Ang et al. | |
| 6,552,410 B1 | 4/2003 | Eaton et al. | |
| 6,578,104 B1 | 6/2003 | Small et al. | |

OTHER PUBLICATIONS

Arul Chinnappan, Claire Tu & Kathleen Murchek, "Clock Networks in the PolarPro (TM) Devices; Application Note 85," Dec. 2005, 11 pages, QuickLogic Corporation.

* cited by examiner

Primary Examiner—Rexford Barnie
Assistant Examiner—Crystal L Hammond

(57) ABSTRACT

An implementation of multiplexer functionality using a multiplexer having half the number of input ports as it has possible output values is provided. A multiplexer having two data input ports performs the function of a multiplexer having four predetermined data input signals ($A_1, A_2, A_3, A_4$). In general, a multiplexer having only m data input ports performs the function of a multiplexer having twice as many predetermined data input signals $A_1, A_2, \ldots, A_j$, where $j=m*2$. The multiplexer functionality may be implemented using a programmable device having one or more macrocells, an inverter and switches such as antifuses.

8 Claims, 13 Drawing Sheets

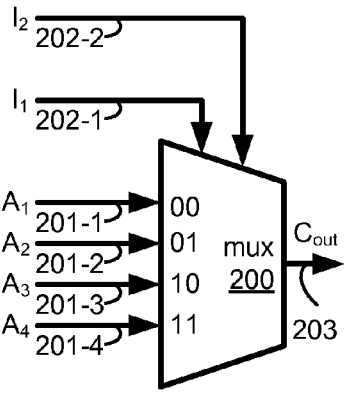
FIGURE 5A
| Select signals | | Output signal |
|---|---|---|
| $I_2$ | $I_1$ | $C_{out}=f(I_1,I_2)$ |
| 0 | 0 | $A_1$ |
| 0 | 1 | $A_2$ |
| 1 | 0 | $A_3$ |
| 1 | 1 | $A_4$ |
FIGURE 5B
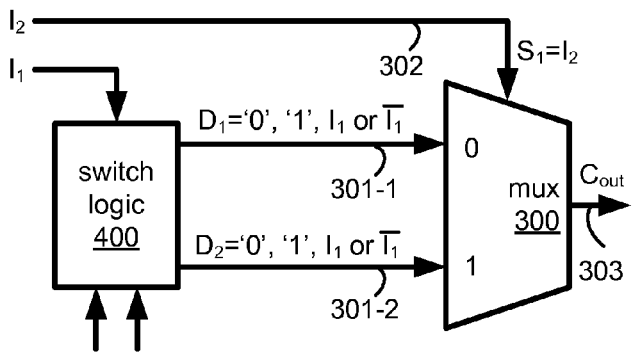
FIGURE 6A
| Input signals | | Output signal |
|---|---|---|
| $I_2$ | $I_1$ | $C_{out}=f(I_1,I_2)$ |
| 0 | 0 | $A_1=f_1(D_1,D_2)$ |
| 0 | 1 | $A_2=f_2(D_1,D_2)$ |
| 1 | 0 | $A_3=f_3(D_1,D_2)$ |
| 1 | 1 | $A_4=f_4(D_1,D_2)$ |
FIGURE 6B
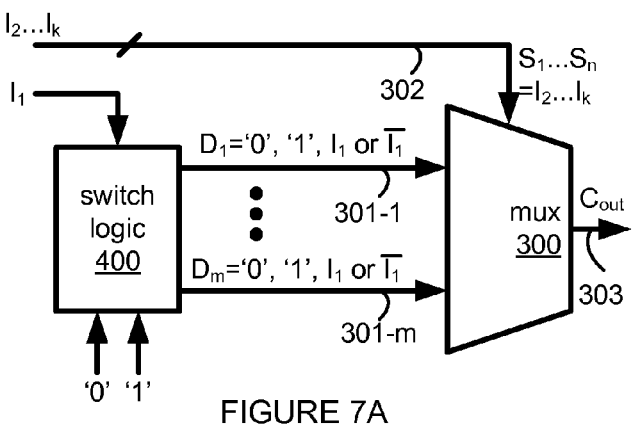
FIGURE 7A
| Input signals | Output signal |
|---|---|
| $I_k...I_1$ | $C_{out}=f(I_1...I_k)$ |
| 0...0 | $A_1=f_1(D_1,...,D_m)$ |
| ••• | ••• |
| 1...1 | $A_j=f_j(D_1,...,D_m)$ |
FIGURE 7B

| Configuration | | Internal data signals | | External variable signals | | Output signal |
|---|---|---|---|---|---|---|
| | | $D_2$ | $D_1$ | $I_2$ | $I_1$ | $C_{out}$ |
| I. | mux with 0, 0 inputs → $C_0$ | 0 | 0 | 0<br>0<br>1<br>1 | 0<br>1<br>0<br>1 | 0<br>0<br>0<br>0 |
| II. | AND: mux with 0, $I_1$ inputs → $C_1$ | $I_1$ | 0 | 0<br>0<br>1<br>1 | 0<br>1<br>0<br>1 | 0<br>0<br>0<br>1 |
| III. | mux with 0, $\overline{I_1}$ inputs → $C_2$ | $\overline{I_1}$ | 0 | 0<br>0<br>1<br>1 | 0<br>1<br>0<br>1 | 0<br>0<br>1<br>0 |
| IV. | mux with 0, 1 inputs → $C_3$ | 1 | 0 | 0<br>0<br>1<br>1 | 0<br>1<br>0<br>1 | 0<br>0<br>1<br>1 |

FIGURE 8A

| Configuration | | Internal data signals | | External variable signals | | Output signal |
|---|---|---|---|---|---|---|
| | | $D_2$ | $D_1$ | $I_2$ | $I_1$ | $C_{out}$ |
| V. | | 0 | $I_1$ | 0 | 0 | 0 |
| | | | | 0 | 1 | 1 |
| | | | | 1 | 0 | 0 |
| | | | | 1 | 1 | 0 |
| VI. | | $I_1$ | $I_1$ | 0 | 0 | 0 |
| | | | | 0 | 1 | 1 |
| | | | | 1 | 0 | 0 |
| | | | | 1 | 1 | 1 |
| VII. | XOR | $\overline{I_1}$ | $I_1$ | 0 | 0 | 0 |
| | | | | 0 | 1 | 1 |
| | | | | 1 | 0 | 1 |
| | | | | 1 | 1 | 0 |
| VIII. | OR | 1 | $I_1$ | 0 | 0 | 0 |
| | | | | 0 | 1 | 1 |
| | | | | 1 | 0 | 1 |
| | | | | 1 | 1 | 1 |

FIGURE 8B

| Configuration | | Internal data signals | External variable signals | | Output signal |
|---|---|---|---|---|---|
| | $I_2$ — 302<br>301-1<br>$D_1$ — 0<br>$D_2$ — 1 — $C_{out}$ — 303<br>301-2 | | | | |
| | | $D_2$ | $D_1$ | $I_2$ | $I_1$ | $C_{out}$ |
| IX. | $I_2$ — NOR<br>$\overline{I_1}$ — 0<br>0 — 1 — $C_8$ | 0 | $\overline{I_1}$ | 0<br>0<br>1<br>1 | 0<br>1<br>0<br>1 | 1<br>0<br>0<br>0 |
| X. | $I_2$ — XNOR<br>$\overline{I_1}$ — 0<br>$I_1$ — 1 — $C_9$ | $I_1$ | $\overline{I_1}$ | 0<br>0<br>1<br>1 | 0<br>1<br>0<br>1 | 1<br>0<br>0<br>1 |
| XI. | $I_2$<br>$\overline{I_1}$ — 0<br>$\overline{I_1}$ — 1 — $C_{10}$ | $\overline{I_1}$ | $\overline{I_1}$ | 0<br>0<br>1<br>1 | 0<br>1<br>0<br>1 | 1<br>0<br>1<br>0 |
| XII. | $I_2$<br>$\overline{I_1}$ — 0<br>1 — 1 — $C_{11}$ | 1 | $\overline{I_1}$ | 0<br>0<br>1<br>1 | 0<br>1<br>0<br>1 | 1<br>0<br>1<br>1 |

FIGURE 8C

| Configuration | | Internal data signals | | External variable signals | | Output signal |
|---|---|---|---|---|---|---|
| | | $D_2$ | $D_1$ | $I_2$ | $I_1$ | $C_{out}$ |
| XIII. | (mux with $I_2$ sel, 1→0, 0→1, out $C_{12}$) | 0 | 1 | 0 | 0 | 1 |
| | | | | 0 | 1 | 1 |
| | | | | 1 | 0 | 0 |
| | | | | 1 | 1 | 0 |
| XIV. | (mux with $I_2$ sel, 1→0, $I_1$→1, out $C_{13}$) | $I_1$ | 1 | 0 | 0 | 1 |
| | | | | 0 | 1 | 1 |
| | | | | 1 | 0 | 0 |
| | | | | 1 | 1 | 1 |
| XV. | NAND (mux with $I_2$ sel, 1→0, $\overline{I_1}$→1, out $C_{14}$) | $\overline{I_1}$ | 1 | 0 | 0 | 1 |
| | | | | 0 | 1 | 1 |
| | | | | 1 | 0 | 1 |
| | | | | 1 | 1 | 0 |
| XVI. | (mux with $I_2$ sel, 1→0, 1→1, out $C_{15}$) | 1 | 1 | 0 | 0 | 1 |
| | | | | 0 | 1 | 1 |
| | | | | 1 | 0 | 1 |
| | | | | 1 | 1 | 1 |

FIGURE 8D

PROGRAMMABLE MULTIPLEXER

CROSS-REFERENCE TO RELATED APPLICATIONS

Not applicable.

BACKGROUND OF THE INVENTION

1. Field of the Invention

The invention relates to programmable logic modules and in particular to multiplexer functionality, for example, in a field-programmable gate arrays or in a programmable application specific integrated circuit.

2. Background of the Invention

A programmable device is a versatile integrated circuit chip, the internal circuitry of which may be configured by an individual user to realize a user-specific circuit. Programmable devices include configurable logic sometimes referred to as field-programmable gate arrays (FPGA), programmable application specific integrated circuits (pASIC), logic cell array (LCA), programmable logic devices (PLD), and complex programmable logic devices (CPLD). To configure a programmable device, the user configures an on-chip interconnect structure of the programmable device so that selected input terminals and selected output terminals of selected on-chip circuit components are electrically connected together in such a way that the resulting circuit is the user-specific circuit desired by the user.

In a programmable device employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting functionality of the circuit. For background information on programmable devices employing antifuses, see, e.g.: U.S. Pat. No. 5,424,655 entitled "Programmable application specific integrated circuit employing antifuses and methods therefor"; U.S. Pat. No. 5,825,201 entitled "Programming architecture for a programmable integrated circuit employing antifuses"; and U.S. Pat. No. 6,426,649 entitled "Architecture for field programmable gate array." The contents of these documents are incorporated herein by reference.

A programmable device may include a plurality of macrocells having fundamental building blocks of a common design. Some macrocells may include multiplexer functionality having a number of data input signals and a number of select input signals. As the need for multiplexers having a greater number of data input signals grows, the silicon real estate needed can more than double for each doubling of the number of inputs. Therefore, a need exists to reduce the silicon real estate needed to perform functions of multiplexers, e.g., having 4 or more data input signals.

SUMMARY

Some embodiments of the present invention provide for a programmable logic device comprising a plurality of macrocells, wherein each macrocell of the plurality of macrocells comprises: a first multiplexer comprising an output port; m data input ports configurable to receive m corresponding signals $D_1, \ldots, D_m$, wherein m is two or more; and n select input ports configurable to receive n corresponding variable signals $S_1, \ldots, S_n$ for routing a selected signal from one of the m data input ports to the output port, wherein n is one or more; an inverter comprising an input port for coupling to a first variable signal $I_1$ and an output port for providing a complement of the first variable signal $\overline{I_1}$; and first switch logic comprising a first plurality of switches each coupled to the output of the inverter and each coupled to a respective one of the m data input ports of the first multiplexer.

Some embodiments of the present invention provide for a method for configuring a programmable logic device to emulate a conventional multiplexer by using a multiplexer having m input ports, wherein the conventional multiplexer has j input ports accepting respective fixed logical values $A_1, A_2, A_3, \ldots, A_j$ and also has k select ports for coupling to k variable signals $I_1, \ldots, I_k$, where m=j/2, the method comprising: providing the fixed logical values $A_1, A_2, A_3, \ldots, A_j$; and selecting a signal from (1) a logical low, (2) a logical high, (3) the first variable signal $I_1$ and (4) a complement of the first variable signal $\overline{I_1}$, based on the fixed logical values $A_1, A_2, A_3, \ldots, A_j$, for each of m signals $D_1, \ldots, D_m$.

These and other aspects, features and advantages of the invention will be apparent from reference to the embodiments described hereinafter.

BRIEF DESCRIPTION OF THE DRAWINGS

Embodiments of the invention will be described, by way of example only, with reference to the drawings.

FIGS. 5A and 5B show a conventional four-data input multiplexer and its corresponding function table.

FIGS. 6A and 6B show a two-data input multiplexer and switch logic and its corresponding function table, in accordance with embodiments of the present invention.

FIGS. 7A and 7B show an m-data input multiplexer and switch logic and its corresponding function table, in accordance with embodiments of the present invention.

FIGS. 8A, 8B, 8C and 8D show various multiplexers configured to emulate a multiplexer having various combinations of predetermined input signals on input data ports and variable input signals on select ports.

DETAILED DESCRIPTION OF THE INVENTION

In the following description, reference is made to the accompanying drawings, which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense. Furthermore, some portions of the detailed description that follows are presented in terms of procedures, steps, logic blocks, processing, and other symbolic representations of operations on data bits that can be performed in electronic circuitry or on computer memory. A procedure, computer executed step, logic block, process, etc., are here conceived to be a self-consistent sequence of steps or instructions leading to a desired result. The steps are those utilizing physical manipulations of physical quantities. These quantities can take the form of electrical, magnetic, or radio signals capable of being stored, transferred, combined, compared, and otherwise manipulated in electronic circuitry or in a computer system. These signals may be referred to at times as bits, values, elements, symbols, characters, terms, numbers, or the like. Each step may be performed by hardware, software, firmware, or combinations thereof.

Figure 1:
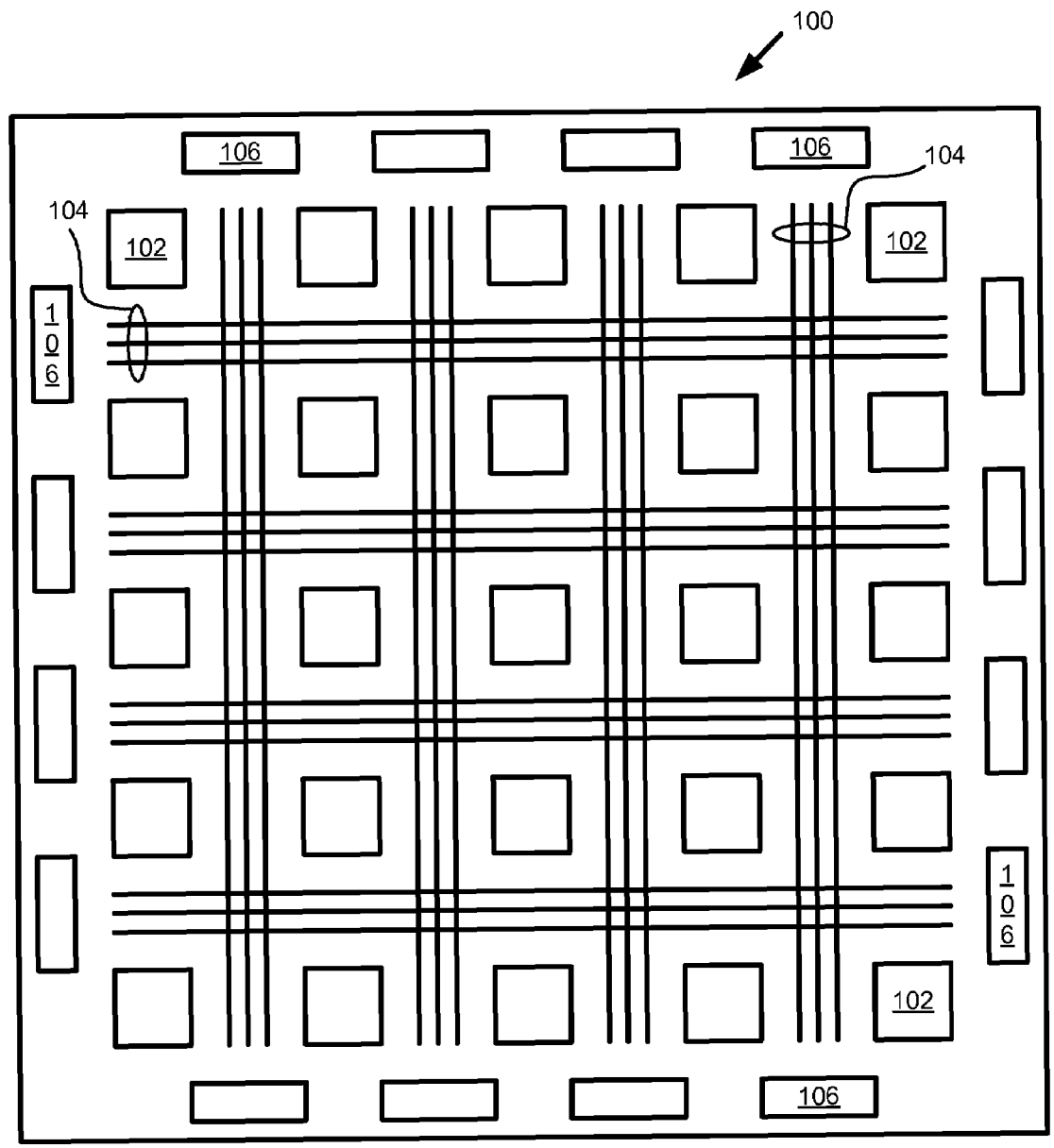
FIG. 1 shows a schematic view of a programmable device, such as a field programmable gate array (FPGA).

FIG. 1 shows a schematic view of a programmable device 100, such as a field programmable gate array (FPGA). Programmable device 100 is shown with five rows and five columns of macrocells 102 and a plurality of interconnecting routing resources 104, shown schematically as horizontal and vertical lines. Programmable device 100 may have more or fewer macrocells 102 than shown in FIG. 1. A plurality of input/output ("I/O") cells 106 is also shown in FIG. 1. Routing resources 104 are populated with programmable elements, such as antifuses (not shown) that may be programmed to interconnect desired macrocells 102 and I/O blocks 106 in various configurations as desired by the user.

To configure a programmable device, the user configures the interconnect structures, i.e., routing resources 104 and antifuses (not shown) disposed between various routing resources so that selected input terminals and selected output terminals of selected on-chip circuit components, e.g., macrocells 102 and I/O cell 106, are electrically connected together in such a way that the resulting circuit performs the desired functionality defined by the user. In a programmable device employing, for example, amorphous silicon antifuses, selected antifuses disposed between selected wire segments are "programmed" to connect the selected wire segments together electrically.

Figure 2:
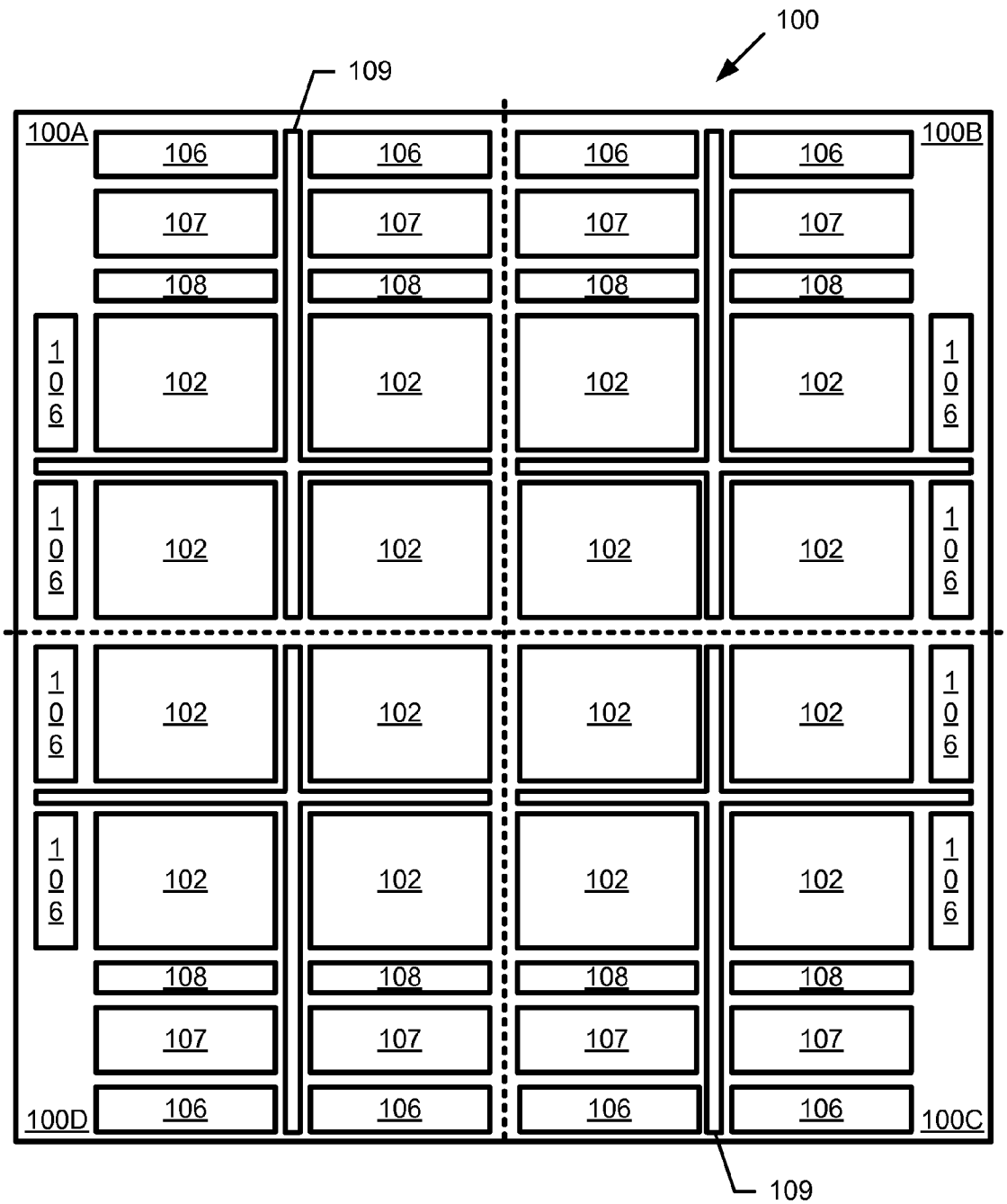
FIG. 2 is another view of an FPGA including a plurality of macrocells and I/O cells.

FIG. 2 is another schematic view of an FPGA (such as programmable device 100 in FIG. 1), including a plurality of macrocells 102 and I/O cells 106. Routing resources 104 are not shown in FIG. 2, for the sake of clarity. As shown in FIG. 2, if desired, programmable device 100 may include embedded circuitry such as RAM 107 and/or one or more additional embedded circuits 108, which may perform any desired function. The RAM 107 and/or embedded circuit 108 may be a non-programmable or partially programmable application specific integrated circuit (ASIC) design. For more information on embedded circuits, such as RAM 107 and embedded circuit 108, see, e.g.: U.S. Pat. No. 6,552,410, entitled "Programmable antifuse interfacing a programmable logic and a dedicated device"; U.S. Pat. No. 6,578,104, entitled "RAM with configurable depth and width"; U.S. Pat. No. 6,519,753, entitled "Programmable device with an embedded portion for receiving a standard circuit design", all of which are incorporated herein by reference. Embedded circuit 108 may be, e.g., a configurable computational unit, such as that described in U.S. Pat. No. 6,483,343, entitled "Configurable computational unit embedded in a programmable device," which is herein incorporated by reference.

Also shown in FIG. 2, are horizontal and vertical programming shift registers 109, a pair of which are located in each quadrant 100A, 100B, 100C, and 100D of programmable device 100. Shift registers 109 are used in programming the desired interconnections within programmable device 100, which will be described in more detail below.

Field programmable gate arrays and programming methodologies are described in general, for example, in U.S. Pat. No. 5,825,201 entitled "Programming architecture for a programmable integrated circuit employing antifuses" and U.S. Pat. No. 5,327,024, entitled "Field programmable antifuse device and programming method therefor," which are incorporated herein by reference.

Each programmable device may include a plurality of macrocells having fundamental building blocks of a common design. Some macrocells may include multiplexer functionality having multiple data input signals and one or more select input signals. In general, a multiplexer allows one of several data input signals to be produced as an output signal. A multiplexer has two or more data input ports, one or more select input ports and an output port. The multiplexer allows one of its several data input signals applied to the respective data input ports to pass through the multiplexer and be produced as its output signal at its output port using one or more select input signals. In other words, a multiplexer enables one line from many to be selected and routed through the multiplexer to the output port.

For example, a multiplexer having two data input ports may have one select line input port used to select which of the two data input signals will be routed to its output port. Similarly, a multiplexer having four data input ports may have two select line input ports used to select which of the four data input signals will be routed to its output port. A multiplexer having eight data input ports may have three select line input ports used to select which of the eight data input signals will be routed to its output port. Such multiplexers may include one or more semiconductor switches, mechanical switches or logical switches.

In accordance with an embodiment of the present invention, the function of a conventional multiplexer having four predetermined data input signals ($A_1$, $A_2$, $A_3$, $A_4$) is performed by switch logic and a multiplexer having only two data input ports. Note that each value $A_i$ is either a logical low signal ('0') or a logical high signal ('1'). In general, the function of a conventional multiplexer having j predetermined data input signals ($A_1$, $A_2$, ..., $A_j$) is performed by combining switch logic with a multiplexer having only half or m data input ports (where m=j/2).

Figure 3:
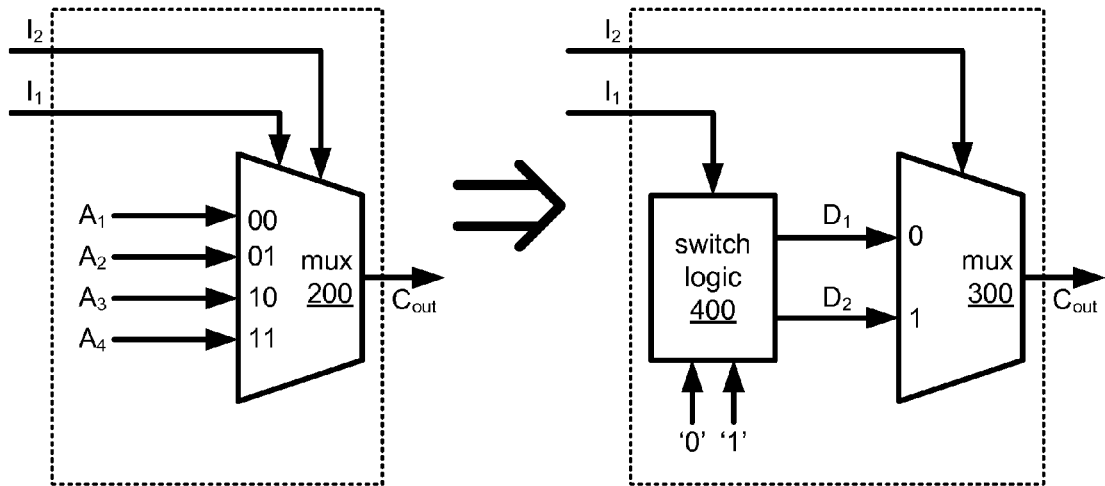
FIG. 3 illustrates an implementation of a four-input multiplexer using a two-input multiplexer and switch logic.

FIG. 3 illustrates an implementation of a conventional four-input multiplexer 200 (mux 200) and a corresponding two-input multiplexer 300 (mux 300) with switch logic 400. On the left and right are two boxes each performing equivalent multiplexer functions, which are each supplied with two variable input signals $I_1$ and $I_2$ and each produce an identical output signal $C_{out}$. The conventional mux 200 on the left uses four input ports where as mux 300 on the right only needs two input ports. On the left, a conventional mux 200 includes four data input ports, two select input ports and an output port. The four data ports are each supplied with a respective one of logical data signals $A_1$, $A_2$, $A_3$ and $A_4$. The select input ports are each supplied with respective select signals $I_1$ and $I_2$. The output signal $C_{out}$ is provided to the output port with a logical value as further described in FIGS. 5A and 5B below.

On the right, mux 300 and switch logic 400 are configured in accordance with an embodiment of the present invention. The combination of mux 300 and switch logic 400 emulates the function of conventional mux 200. Mux 300 accepts the second input signal $I_2$ as its select input signal and also accepts data input signals $D_1$ and $D_2$ from switch logic 400 as its data input signals. The first input signal $I_1$ is provided to switch logic 400, which provides data signals $D_1$ and $D_2$ to mux 300. Mux 300 also produces the output signal $C_{out}$ at its output port as described further below with respect to FIGS. 6A and 6B.

Figure 4:
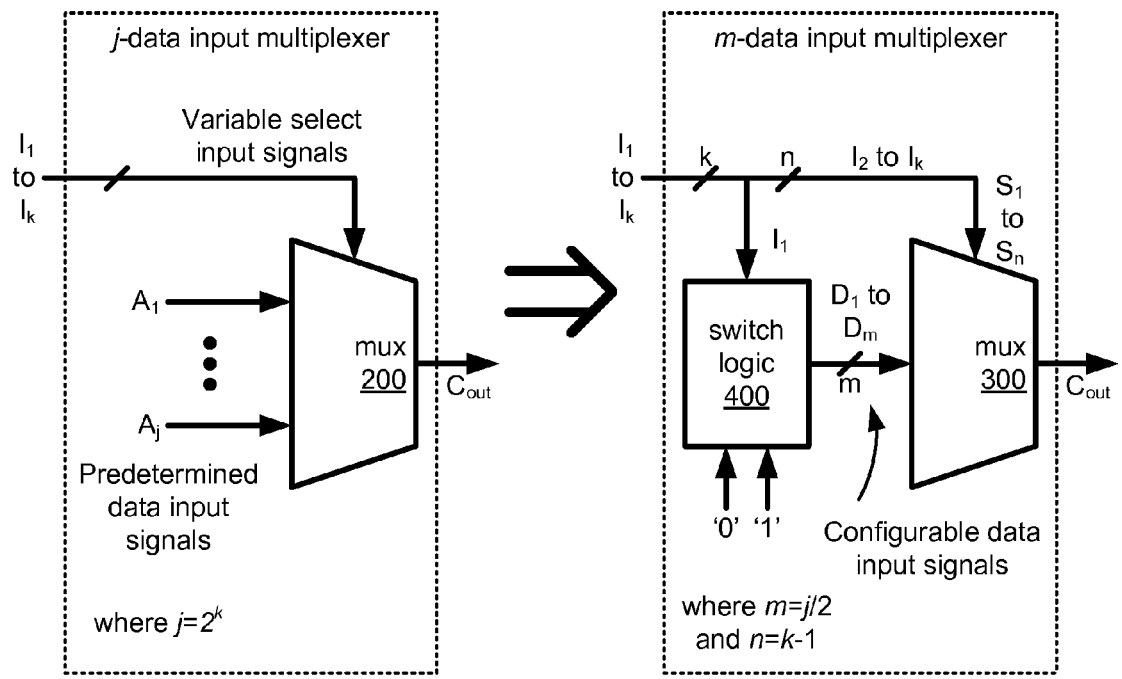
FIG. 4 illustrates an implementation of a j-data input multiplexer using an m-data input multiplexer and switch logic.

FIG. 4 illustrates an implementation of a j-data input multiplexer 200 using an m-data input multiplexer 300 and switch logic 400. On the left and right are two boxes each performing equivalent multiplexer functions, which are each supplied with multiple variable input signals $I_1, I_2, \ldots, I_k$ and producing an identical output signal $C_{out}$. The conventional mux 200 on the left uses twice as many input ports as does mux 300 on the right. On the left, a conventional mux 200 includes j data input ports, k select input ports and an output port. The j data input ports are each supplied with a respective one of logical data signals $A_1, A_2, \ldots, A_j$. The select input ports are each supplied with respective select signals $I_1, I_2, \ldots, I_k$. The output signal $C_{out}$ is provided to the output port with a logical value of the selected data input signal.

On the right, mux 300 and switch logic 400 are configured in accordance with an embodiment of the present invention. Again, the combination of mux 300 and switch logic 400 emulates the function of conventional mux 200. Mux 300 accepts the one or more signals $I_2 \ldots I_k$ as its select input signals $S_1 \ldots S_n$ and also accepts signals $D_1 \ldots D_m$ from switch logic 400 as its data input signals. The first input signal $I_1$ is provided to switch logic 400, which provides data input signals $D_1 \ldots D_m$ to mux 300. Mux 300 also produces the output signal $C_{out}$ at its output port as described further below with respect to FIGS. 7A and 7B.

In accordance with some embodiments of the present invention, mux 300 includes m data input ports 301 for m data input signals ($D_1, D_2, D_3, \ldots, D_m$), n select input ports 302 for n select input signals ($S_1, S_2, S_3, \ldots, S_n$), where $m=2^n$, $S_i=I_{i+1}$ for i=1 to n where n=k-1, and one output port 303 for providing output signal $C_{out}$. Switch logic 400 is configured to supply m signals selected from the set of (1) a logical low ('0'), (2) a logical high ('1'), (3) the first input signal $I_1$, and (4) the complement of the first input signal ($\overline{I_1}$). This combination of an m input port mux 300 and switch logic 400, which supplies a selected one of four signals to each input port of mux 300, emulates the function of a j-input port conventional mux 200 having predetermined inputs $A_1, A_2, A_3, \ldots, A_j$ and k select input signals, where $j=2^k$, $k=(n+1)$ and $j=m*2$.

FIGS. 5A and 5B show a conventional four-data input multiplexer 200 and its corresponding function table. Conventional mux 200 includes four data input ports 201, two select input ports 202 and an output port 203. The four data input ports 201 (201-1, 201-2, 201-3, 203-4) are supplied with respective predetermined logical data signals $A_1, A_2, A_3$ and $A_4$. The select input ports 202 (202-1, 202-2) are each supplied with respective select signals $I_1$ and $I_2$. The output signal $C_{out}$ is provided to output port 203 with a logical value as further described in the table of FIG. 5B.

The table of FIG. 5B shows resulting output signals for conventional mux 200 of FIG. 5A. Select signals $I_1$ and $I_2$ define which one of the input data signals $A_1, A_2, A_3$ and $A_4$ is provided as output signal $C_{out}$. For example, with both select signals set to a logical low value ($I_1=0$ and $I_2=0$), conventional mux 200 provides an output signal $C_{out}=A_1$. With the first select signal set to a logical high value ($I_1=1$) and the second select signal set to a logical low value ($I_2=0$), conventional mux 200 provides an output signal $C_{out}=A_2$. With the first select signal set to a logical low value ($I_1=0$) and the second select signal set to a logical high value ($I_2=1$), conventional mux 200 provides an output signal $C_{out}=A_3$. With both select signals set to a logical high value ($I_1=1$ and $I_2=1$), conventional mux 200 provides an output signal $C_{out}=A_4$.

In accordance with an embodiment of the present invention, the functionality of mux 200 of FIG. 5A may be replaced with mux 300 of FIG. 6A. That is, a multiplexer 300 having two configurable data input ports may perform the function of a conventional multiplexer 200 having four predetermined data input signals ($A_1, A_2, A_3, A_4$). In general, a multiplexer 300 having m configurable data input ports performs the function of a multiplexer 200 having twice as many predetermined data input signals ($A_1, A_2, \ldots, A_j$, where j=m*2).

FIGS. 6A and 6B show a two-data input multiplexer 300 and switch logic 400 and its corresponding function table, in accordance with embodiments of the present invention. Mux 300 includes two data ports 301, one select port 302 and one output port 303. For input signals, mux 300 includes two data ports 301 (301-1, 301-2) to receive signals $D_1$ and $D_2$ and a single input select port 302 to receive signal $S_1$. Mux 300 produces an output signal $C_{out}$ on output port 303.

In accordance with an embodiment of the present invention, data ports 301-1 and 301-2 of mux 300 are each supplied with a selectable one of a (1) logical low value ('0'), (2) a logical high value ('1'), (3) the first signal ($I_1$) and (4) the logical compliment of the first signal ($\overline{I_1}$) as respective signals $D_1$ and $D_2$. In other words, input data signal $D_1$ is configurable to be any selected one of the four values ('0', '1', $I_1$ or $\overline{I_1}$) and input data signal $D_2$ is also independently configurable to be any selected one of the four values ('0', '1', $I_1$ or $\overline{I_1}$). The single select port 302 is supplied with signal $S_1$, which is set to the second signal ($I_2$). Switch logic 400 is coupled to mux 300 with data signals $D_1$ and $D_2$. For input signals, switch logic 400 accepts the first signal ($I_1$), a logical low value ('0'), and a logical high value ('1'). Switch logic 400 may also include an internal inverter to produce signal $\overline{I_1}$. Alternatively, the inverter may be separate from switch logic 400 and signal $\overline{I_1}$ may be supplied as another input to switch logic 400. Switch logic 400 also includes two output ports to provide output signals $D_1$ and $D_2$ to input ports 301-1 and 301-2 of mux 300.

Thus, switch logic 400 provides mux 300 with a first input signal $D_1$ set to one of '0', '1', $I_1$ or $\overline{I_1}$ and a second input signal $D_2$ set to one of '0', '1', $I_1$ or $\overline{I_1}$. Mux 300 also accepts a select signal $S_1$ set to value $I_2$. Note conventional mux 200 includes two select signals ($I_1$ and $I_2$) and four data input signals ($A_1, A_2, A_3, A_4$), where as mux 300 performing the same function includes a single select signal ($S_1=I_2$) and two data input signals ($D_1, D_2$) provided by switch logic 400. Also note that some configurations of switch logic 400 result in mux 300 not receiving either $I_1$ or $\overline{I_1}$. That is, when $D_1$='0' and $D_2$='0', $D_1$='0' and $D_2$='1', $D_1$='1' and $D_2$='0' or $D_1$='1' and $D_2$='1', select signal $I_1$ is not used even though it may be supplied to switch logic 400.

When values $A_1, A_2, A_3$ and $A_4$, which are applied to input ports 201 of conventional mux 200, are known a priori, mux 300, having only two data input ports 301, may perform the function of conventional mux 200 of FIG. 5A. By appropriately selecting what input signals $D_1$ and $D_2$ are supplied to input ports 301-1 and 301-2 and what select signal $S_1$ is supplied to select port 302, mux 300 performs the function of conventional mux 200. That is, the set of possible output signals ($A_1, A_2, A_3$ and $A_4$) of mux 300 is a function of what data signals ($D_1$ and $D_2$) are supplied to input ports 301.

FIG. 6B shows four possible outputs $A_1, A_2, A_3$ and $A_4$ for output signal $C_{out}$ of mux 300 for the four possible combinations of signals $I_1$ and $I_2$. As shown in the table, an output signal of $C_{out}=A_1, A_2, A_3$ or $A_4$ is provided when input signals $I_2$ and $I_1$ are "00", "01", "10" or "11" respectively. However, $C_{out}$ is no longer only a function of input signals $I_1$ and $I_2$ as was the case with conventional mux 200. Each value $A_i$ (for i=1 to 4) is now a function of $D_1$ and $D_2$. Thus, to determine a particular $A_i$, values $D_1$ and $D_2$ must be known. Furthermore, any of the 16 possible combinations of values for $A_1$, $A_2$, $A_3$ and $A_4$ may be implemented based on the particular values selected for $D_1$ and $D_2$. As described above, some possible combinations of $D_1$ and $D_2$ include signal $I_1$ or $\overline{I_1}$ while other possible combinations of $D_1$ and $D_2$ exclude signals $I_1$ and $\overline{I_1}$. In total, there are 16 possible combinations of $D_1$ and $D_2$ as described below with reference to FIGS. 8A to 8D.

FIGS. 7A and 7B show an m-data input multiplexer 300 and switch logic 400 and its corresponding function table, in accordance with embodiments of the present invention. In general, a conventional mux 200 having predetermined data input signals $A_1, A_2, A_3, \ldots, A_j$ and k select input signals may be implemented using a multiplexer 300 having m data signals $D_1, D_2, D_3, \ldots, D_m$ and n select signals $S_1, S_2, S_3, \ldots, S_n$ and switch logic 400, where j=m*2 and k=(n+1).

In FIG. 7A, switch logic 400 accepts input signals '0', '1' and $I_1$, and provides output signals $D_1, D_2, D_3, \ldots, D_m$ to mux 300. Mux 300 accepts input signals $D_1, D_2, D_3, \ldots, D_m$ as data input signals at ports 301-1 to 301-m and also accepts input signals $S_1, S_2, S_3, \ldots, S_n$ as select input signals at ports 302. Again, each data input signal $D_i$ (for i=1 to m) may independently be set to one value from the four possible values ('0', '1', $I_1$ and $\overline{I_1}$). Select input signals $S_1, S_2, S_3, \ldots, S_n$ may be respectively set to corresponding select signals $I_2, I_3, I_4, \ldots, I_k$. Mux 300 produces output signal $C_{out}$ at port 303. As shown in FIG. 7B, an output signal of $C_{out}=A_1$ to $A_j$ (where j=2*m) is provided when input signals $I_k$ to $I_1$ form the respective j combinations "0 . . . 0" to "1 . . . 1", where j=$2^k$. However, each $A_i$ (for i=1 to j) is now a function of signals $D_1$ to $D_m$. For example, $A_1=f_1(D_1$ to $D_m)$. Thus, to determine a particular $A_i$, values $D_1$ to $D_m$ must be appropriately set. Furthermore, any of the $2^j$ possible combinations of values for $A_1$ to $A_j$ may be implemented based on the particular set of values selected for $D_1$ to $D_m$, of which there is a corresponding $2^j$ possible combinations.

FIGS. 8A, 8B, 8C and 8D show various two-data input multiplexers 300 configured to emulate a conventional multiplexer 200 having various permutations of predetermined input signals $A_1$ to $A_4$ on input data ports 201 and variable input signals on select ports 202. Any permutation of logical high and logical low output values ($A_1$, $A_2$, $A_3$ and $A_4$) will result by the appropriate selection of values provided to data input ports 301 and to select input port 302 of mux 300. Each of the configurations (configurations I through XVI shown in FIGS. 8A, 8B, 8C and 8D) is defined by two predetermined input signals ($D_1$ and $D_2$), which are supplied to respective input ports 301-1 and 301-2. The variable signal $I_1$ may or may not be supplied to one of the data input ports 301 depending on the particular implemented configuration. Additionally, the variable select signal $I_2$ is supplied as a variable input signal to select port 302. For each configuration and for each and combination of variable signals $I_1$ and $I_2$, a particular output signal $C_{out}$ is produced as described below.

FIG. 8A shows four configurations (I, II, III, IV) as defined by configured values $D_1$ and $D_2$ provided to data input ports 301 of mux 300. In configuration I, data input ports 301 carry signals $D_1$ and $D_2$, which are supplied with a logical low value ('0'). For configuration I, the resulting output values $C_{out}$ are $C_0=\{A_1$='0', $A_2$='0', $A_3$='0', $A_4$='0'$\}$ for any combination of input values $I_1$ and $I_2$.

In configuration II, the input signal $D_1$ at the first input port 301-1 is '0' and at the second input signal $D_2$ at the second data input port 301-2 is $I_1$ resulting in $C_{out}=C_1$ as values $\{'0', '0', '0', '1'\}$ for input values $(I_2,I_1)=\{(0,0), (0,1), (1,0), (1,1)\}$, respectively. Configuration II acts as an AND gate having inputs $I_1$ and $I_2$ and an output $C_1$.

In configuration III, the first and second data input ports 301-1 and 301-2 are provided signals $D_1$='0' and $D_2=\overline{I_1}$ resulting in output value $C_{out}$ of $C_2=\{0, 0, 1, 0\}$ for input values $(I_2, I_1)=\{(0,0), (0,1), (1,0), (1,1)\}$, respectively.

In configuration IV, the first and second data input ports 301-1 and 301-2 are provided signals $D_1$='0' and $D_2$='1' resulting in output value $C_{out}$ of $C_3=\{0, 0, 1, 1\}$ for input values $(I_2, I_1)=\{(0,0), (0,1), (1,0), (1,1)\}$, respectively.

FIG. 8B shows four more configurations (V, VI, VII and VIII) and corresponding output signals. In configuration V, first and second data input ports 301 are provided signals $D_1=I_1$ and $D_2$='0' resulting in output value $C_{out}$ of $C_4=\{0, 1, 0, 0\}$ for input values $(I_2, I_1)=\{(0,0), (0,1), (1,0), (1,1)\}$, respectively.

In configuration VI, data input ports 301 are provided signals $D_1=I_1$ and $D_2=I_1$ resulting in output value $C_{out}$ of $C_5=\{0, 1, 0, 1\}$ for input values $(I_2, I_1)=\{(0,0), (0,1), (1,0), (1,1)\}$, respectively.

In configuration VII, data input ports 301 are provided signals $D_1=I_1$ and $D_2=\overline{I_1}$ resulting in output value $C_{out}$ of $C_6=\{0, 1, 1, 0\}$ for input values $(I_2, I_1)=\{(0,0), (0,1), (1,0), (1,1)\}$, respectively. Configuration VII acts as an XOR gate having inputs $I_1$ and $I_2$ and an output $C_6$.

In configuration VIII, data input ports 301 are provided signals $D_1=I_1$ and $D_2$='1' resulting in output value $C_{out}$ of $C_7=\{0, 1, 1, 1\}$ for input values $(I_2, I_1)=\{(0,0), (0,1), (1,0), (1,1)\}$, respectively. Configuration VIII acts as an OR gate having inputs $I_1$ and $I_2$ and an output $C_7$.

FIG. 8C shows four more configurations (IX, X, XI and XII) and corresponding output signals. In configuration IX, data input ports 301 are provided signals $D_1=\overline{I_1}$ and $D_2$='0' resulting in output value $C_{out}$ of $C_8=\{1, 0, 0, 0\}$ for input values $(I_2, I_1)=\{(0,0), (0,1), (1,0), (1,1)\}$, respectively. Configuration IX acts as an NOR gate having inputs $I_1$ and $I_2$ and an output $C_8$.

In configuration X, data input ports 301 are provided signals $D_1=\overline{I_1}$ and $D_2=I_1$ resulting in output value $C_{out}$ of $C_9=\{1, 0, 0, 1\}$ for input values $(I_2, I_1)=\{(0,0), (0,1), (1,0), (1,1)\}$, respectively. Configuration X acts as an XNOR gate having inputs $I_1$ and $I_2$ and an output $C_9$.

In configuration XI, data input ports 301 are provided signals $D_1=\overline{I_1}$ and $D_2=\overline{I_1}$ resulting in output value $C_{out}$ of $C_{10}=\{1, 0, 1, 0\}$ for input values $(I_2, I_1)=\{(0,0), (0,1), (1,0), (1,1)\}$, respectively.

In configuration XII, data input ports 301 are provided signals $D_1=\overline{I_1}$ and $D_2$='1' resulting in output value $C_{out}$ of $C_{11}\{1, 0, 1, 1\}$ for input values $(I_2, I_1)=\{(0,0), (0,1), (1,0), (1,1)\}$, respectively.

FIG. 8D shows show four more configurations (XIII, XIV, XV and XVI) and corresponding output signals. In configuration XIII, data input ports 301 are provided signals $D_1$='1' and $D_2$='0' resulting in output value $C_{out}$ of $C_{12}\{1, 1, 0, 0\}$ for input values $(I_2, I_1)\{(0,0), (0,1), (1,0), (1,1)\}$, respectively.

In configuration XIV, data input ports 301 are provided signals $D_1$='1' and $D_2=I_1$ resulting in output value $C_{out}$ of $C_{13}\{1, 1, 0, 1\}$ for input values $(I_2, I_1)\{(0,0), (0,1), (1,0), (1,1)\}$, respectively.

In configuration XV, data input ports 301 are provided signals $D_1$='1' and $D_2=\overline{I_1}$ resulting in output value $C_{out}$ of $C_{14}=\{1, 1, 1, 0\}$ for input values $(I_2, I_1)=\{(0,0), (0,1), (1,0), (1,1)}, respectively. Configuration XV acts as an NAND gate having inputs $I_1$ and $I_2$ and an output $C_{14}$.

In configuration XVI, data input ports 301 are provided signals $D_1$='1' and $D_2$='1' resulting in output value $C_{out}$ of $C_{15}$={1, 1, 1, 1} for input values $(I_2, I_1)$={(0,0), (0,1), (1,0), (1,1)}, respectively.

Switching logic may be used to determine which signals are provided as inputs to the multiplexer. That is, switching logic (such as switch logic 400) may be configured to supply selected signals to each of the data input ports (such as ports 301) of a multiplexer (such as mux 300). Switching logic may use mechanical, electrical, optical, electromagnetic and/or magnetic technology. Switching logic may include programmable switches such as program-once switches or re-programmable switches. Switching logic may be implemented with semiconductor technology, semiconductor switches, or alternatively with mechanical switches. Semiconductor switches may include one or more transistors, fuses and/or antifuses. Switching logic is functionally positioned on the input side of a multiplexer (such as mux 300) and is used to supply of selectable or configurable values to the multiplexer. Switching logic may include crossbar switching functionality such as in a crossbar or cross-point switch or may include changeover switches. Switching logic may include a multiplexer having multiple inputs and a single output providing a selectable data signal as its output signal. Switching logic may include single-pole-double-throw (SPDT) switches, single-pole-multi-throw (SPMT) switches and/or the like. Switching logic may provide permanently configured switches such as provided by fuses and antifuses, or may provide semi-permanently configured switching such as provided by memory logic, or may provide dynamically configurable switching such as provided by some transistor and other semiconductor based switches.

Figure 9A:
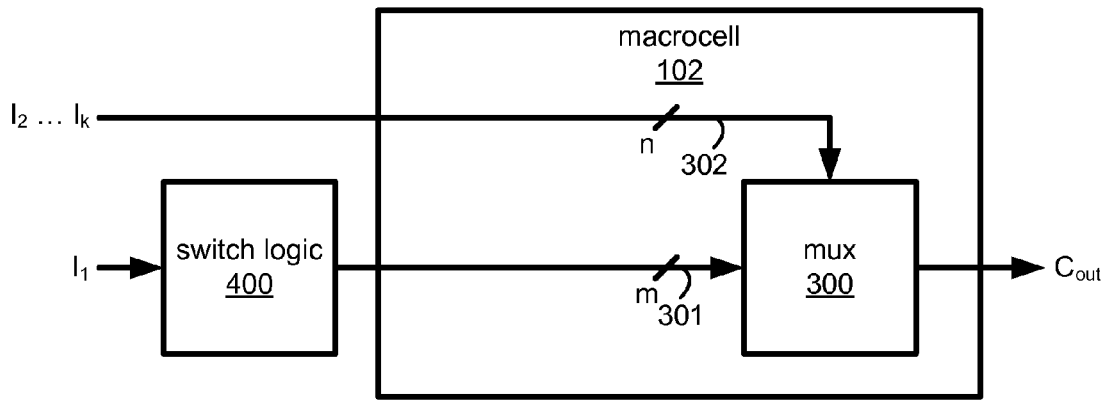
FIGS. 9A, 9B and 9C show alternative relationships between a macrocell and switch logic, in accordance with some embodiments of the present invention.
Figure 9B:
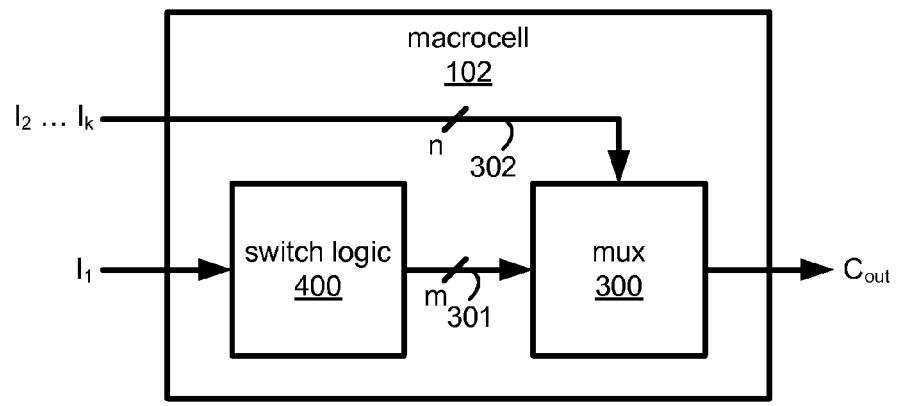
Figure 9C:
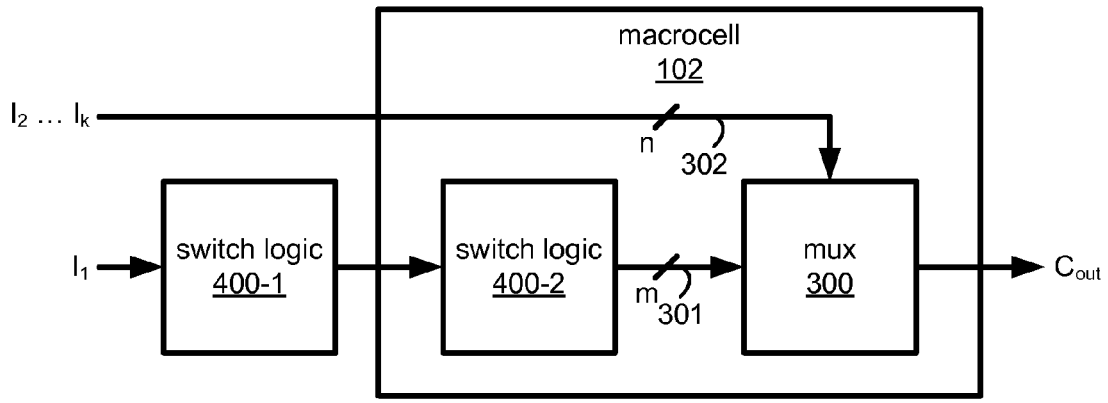

FIGS. 9A, 9B and 9C show alternative relationships between a macrocell 102 and switch logic 400, in accordance with several embodiments of the present invention. Switch logic 400 accepts a first select signal $I_1$. In some embodiments, the remaining n select signals $I_2$ to $I_k$ bypass switch logic 400, while in other embodiments, switch logic 400 also accepts the remaining n select signals $I_2$ to $I_k$ for passing through to a mux 300. In some embodiments, both $I_1$ and $\overline{I_1}$ are provided to switch logic 400, while in other embodiments, only $I_1$ is provided to switch logic 400 and $\overline{I_1}$ is generated within switch logic 400. In some embodiments, switch logic 400 accepts the logical low signal ('0') and logical high signal ('1'), whereas in other embodiments, one or both logical signals are internally generated. For clarity, the logic low and high signals are not illustrated in some of the following figures.

FIG. 9A shows switch logic 400 positioned distinct from a macrocell 102 containing mux 300. Select signal $I_1$ is supplied to switch logic 400. In turn, switch logic 400 provides m data signals $D_1, D_2, D_3, \ldots, D_m$ to m data input ports 301 of mux 300 in macrocell 102. The remaining signals $I_2, I_3, I_4, \ldots, I_k$ are provided as n select signals $S_1, S_2, S_3, \ldots, S_n$ to n select input ports 302 of mux 300 in macrocell 102.

FIG. 9B shows switch logic 400 and mux 300 both contained within a macrocell 102. Switch logic 400 and macrocell 102 accept a first signal $I_1$. As described above, switch logic 400 again provides m data signals $D_1, D_2, D_3, \ldots, D_m$ to m data input terminals 301 of mux 300 and the remaining signals $I_2, I_3, I_4, \ldots, I_k$ are provided as n select signals $S_1, S_2, S_3, \ldots, S_n$ to n select input terminals 302 of mux 300.

FIG. 9C shows switch logic 400 partially positioned outside of and partially positioned within a macrocell 102 containing mux 300. Switch logic 400 comprise a plurality of switches forming a switch logic 400-1 and 400-2. Some of this plurality of switches existed in switch logic 400-1 that is positioned distinct from macrocell 102, while others of this plurality of switches existed within switch logic 400-2 that is positioned within macrocell 102.

FIGS. 10A, 10B, 10C and 10D show circuitry of a macrocell containing a multiplexer 300 and corresponding switch logic 400, in accordance with some embodiments of the present invention. In each figure, switch logic 400 is supplied with a first input signal $I_1$. Additionally, switch logic 400 may also be supplied with the signal $\overline{I_1}$, which is a complement of the first input signal $I_1$, a logical low ('0') and/or logical high ('1') values.

Figure 10A:
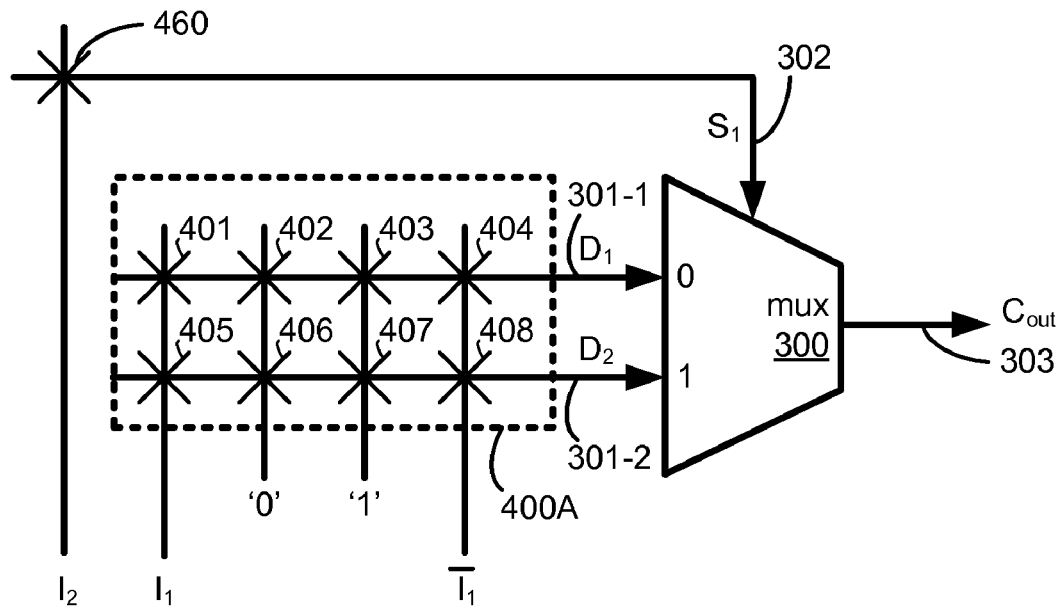
FIGS. 10A, 10B, 10C and 10D show circuitry of a macrocell containing a multiplexer and corresponding switch logic, in accordance with some embodiments of the present invention.

In FIG. 10A, mux 300 with data input signals $D_1$ and $D_2$ and switch logic 400A, which may be used to emulate a four-input multiplexer having four predetermined inputs $A_1$, $A_2$, $A_3$ and $A$, in accordance with an embodiment of the present invention. Switch logic 400A includes four input ports for signals '0', '1', $I_1$ and $\overline{I_1}$, and two output ports for data signals $D_1$ and $D_2$. Switch logic 400A also includes a crossbar configuration of switches including switches 401-408. If switch 401 is operable to conduct a signal and switches 402, 403 and 404 are not be operable to conduct signals, input signal $I_1$ is provided as signal $D_1$ to input port 301-1. If switch 402 is conducting and switches 401, 403 and 404 are non-conducting, a logical low signal ('0') is provided as signal $D_1$ to input port 301-1. If switch 403 is conducting and switches 401, 402 and 404 are non-conducting, a logical high signal ('1') is provided as signal $D_1$ to input port 301-1. If switch 404 is conducting and switches 401, 402 and 403 are non-conducting, complement input signal $\overline{I_1}$ is provided as signal $D_1$ to input port 301-1. Similarly, switch 405, 406, 407 or 408, when conducting, may be used to provide $I_1$, '0', '1', or $\overline{I_1}$, respectively, as signal $D_2$ to input port 301-2. Additionally, a switch 460, which may or may not be part of switch logic 400A, may be used to couple input signal $I_2$ to port 302.

Figure 10B:
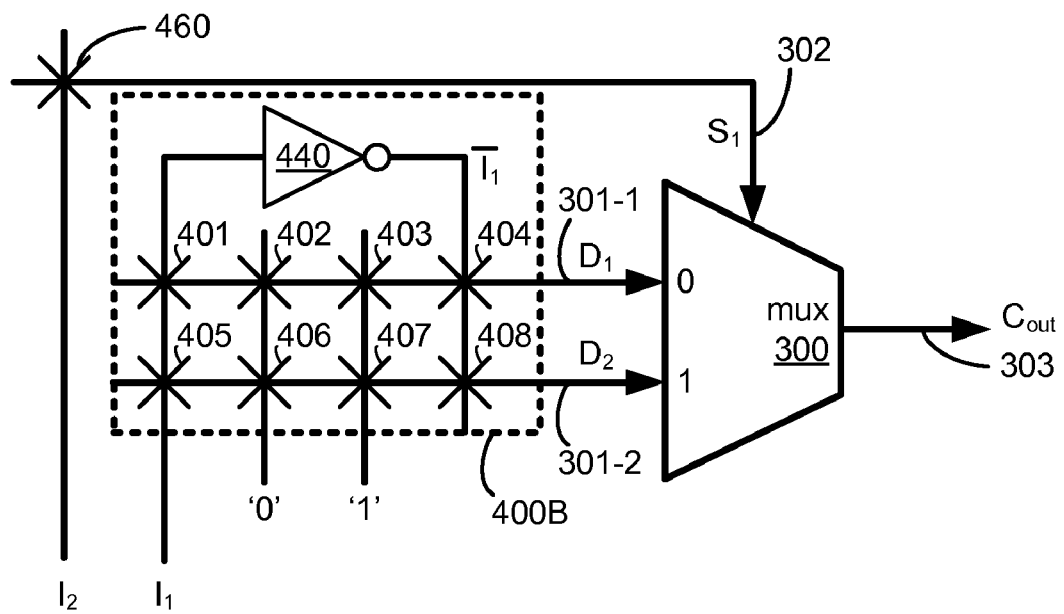

In FIG. 10B, switch logic 400B is similar to switch logic 400A of FIG. 10A. Rather than four input ports, switch logic 400B includes three input ports for signals '0', '1' and $I_1$ and two output ports for signals $D_1$ and $D_2$. Switch logic 400B also includes an inverter 440 for generating complement signal $\overline{I_1}$. Switches 401 to 408 of switch logic 400B operate as described above with reference to switch logic 400A.

Figure 10C:
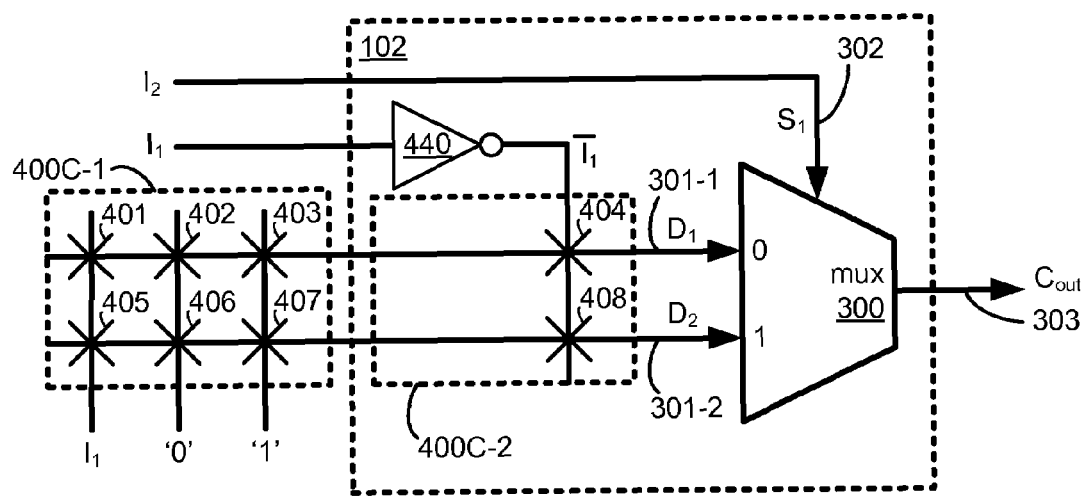

In FIG. 10C, shows a first portion of switch logic 400C-1 and a macrocell 102. Macrocell 102 includes a first multiplexer 300, an inverter 440 and a second portion of switch logic 400C-2. The first portion of switch logic 400C-1 includes a plurality of switches 401-403 and 405-407 and may be separate from macrocell 102 and positioned outside of macrocell 102 (similar to switch logic 400-1 of FIG. 9C). Alternatively, the first portion of switch logic 400C-1 may be a module within macrocell 102 (not shown). The second portion of switch logic 400C-2 may be positioned inside of macrocell 102 (as shown) (similar to switch logic 400-2 of FIG. 9C). Alternatively, the second portion of switch logic 440C-2 may be positioned outside of macrocell 102 (not shown).

Mux 300 includes m data input ports configurable to receive signals $D_1, \ldots, D_m$, wherein m is two or more and n select input ports configurable to receive signals $S_1, \ldots, S_n$ for routing a selected signal from one of the m data input ports to an output port, wherein n is one or more. Inverter 440 includes an input port for coupling to a first variable signal $I_1$ and an output port for providing a complement of the first variable signal $\overline{I_1}$ to the second portion of switch logic 400C-2. The second portion of switch logic 400C-2 includes a plurality of switches 404 and 408 coupled to the output of inverter 440 and each coupled to a respective one of the m data input ports of mux 300. That is, switch 404 has a first terminal coupled to the output of inverter 440 and second terminal coupled to data input port 301-1 and switch 408 has a first terminal coupled to the output of inverter 440 and a second terminal coupled to data output port 301-2.

Figure 10D:
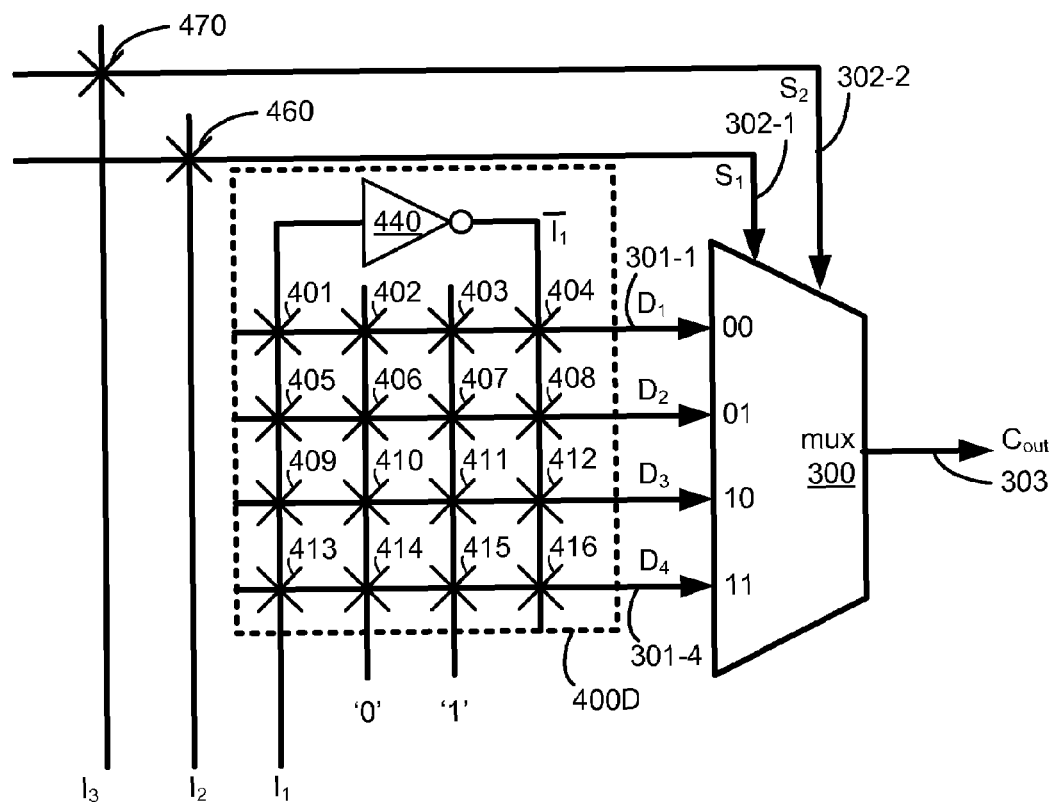

The FIG. 10D shows a four-input mux 300 and accompanying switch logic 400D. In accordance with an embodiment of the present invention, mux 300 and switch logic 400D switch four data signals ($D_1$, $D_2$, $D_3$ and $D_4$) and may be used to emulate an eight-input multiplexer having eight predetermined inputs $A_1$, $A_2$, $A_3$, $A_4$, $A_5$, $A_6$, $A_7$ and $A_8$ (e.g., conventional mux 200 of FIG. 4 with j=8 and k=3).

Switch logic 400D provides four signals ($D_1$, $D_2$, $D_3$ and $D_4$) as inputs to mux 300. For switching a selected one of signals '0', '1', $I_1$ and $\overline{I_1}$ to mux 300 as data signal $D_1$, switch logic 400D includes switches 401, 402, 403 and 404. For switching a selected one of signals '0', '1', $I_1$ and $\overline{I_1}$ to mux 300 as data signal $D_2$, switch logic 400D includes switches 405, 406, 407 and 408. For switching a selected one of signals '0', '1', $I_1$ and $\overline{I_1}$ to mux 300 as data signal $D_3$, switch logic 400D includes switches 409, 410, 411 and 412. For switching a selected one of signals '0', '1', $I_1$ and $\overline{I_1}$ to mux 300 as data signal $D_4$, switch logic 400D includes switches 413, 414, 415 and 416.

Two select input signals $S_1$ and $S_2$ are provided to mux 300 to direct which one of data inputs $D_1$, $D_2$, $D_3$ and $D_4$ is routed to output port 303 as signal $C_{out}$. Select signals $S_1$ and $S_2$ may be feed directly to the circuit from their sources or alternatively may be switched to the selection input ports 302 of mux 300. For example, switch 460 may be used to conduct selection signal $I_2$ as select signal $S_1$ to first select port 302-1 and switch 470 may be used to conduct selection signal $I_3$ as select signal $S_2$ to second select port 302-2. Additionally, switches 460 and 470 may or may not be part of switch logic 400D.

A multiplexer 300 may be formed with multiple sub-multiplexers (i.e., a multiplexer with fewer inputs) arranged in a tree structure with output signals of one sub-multiplexer feeding the input port of another sub-multiplexer. That is, an m-input multiplexer 300 may be formed with three or more m/2-input or smaller multiplexers. For example, a four-input multiplexer 300 may be formed with three two-input multiplexers as described below with reference to FIG. 11. An eight-input multiplexer 300 may be formed with two four-input multiplexers and a two-input multiplexer. Alternatively, an eight-input multiplexer 300 may be formed with seven two-input multiplexers.

Figure 11:
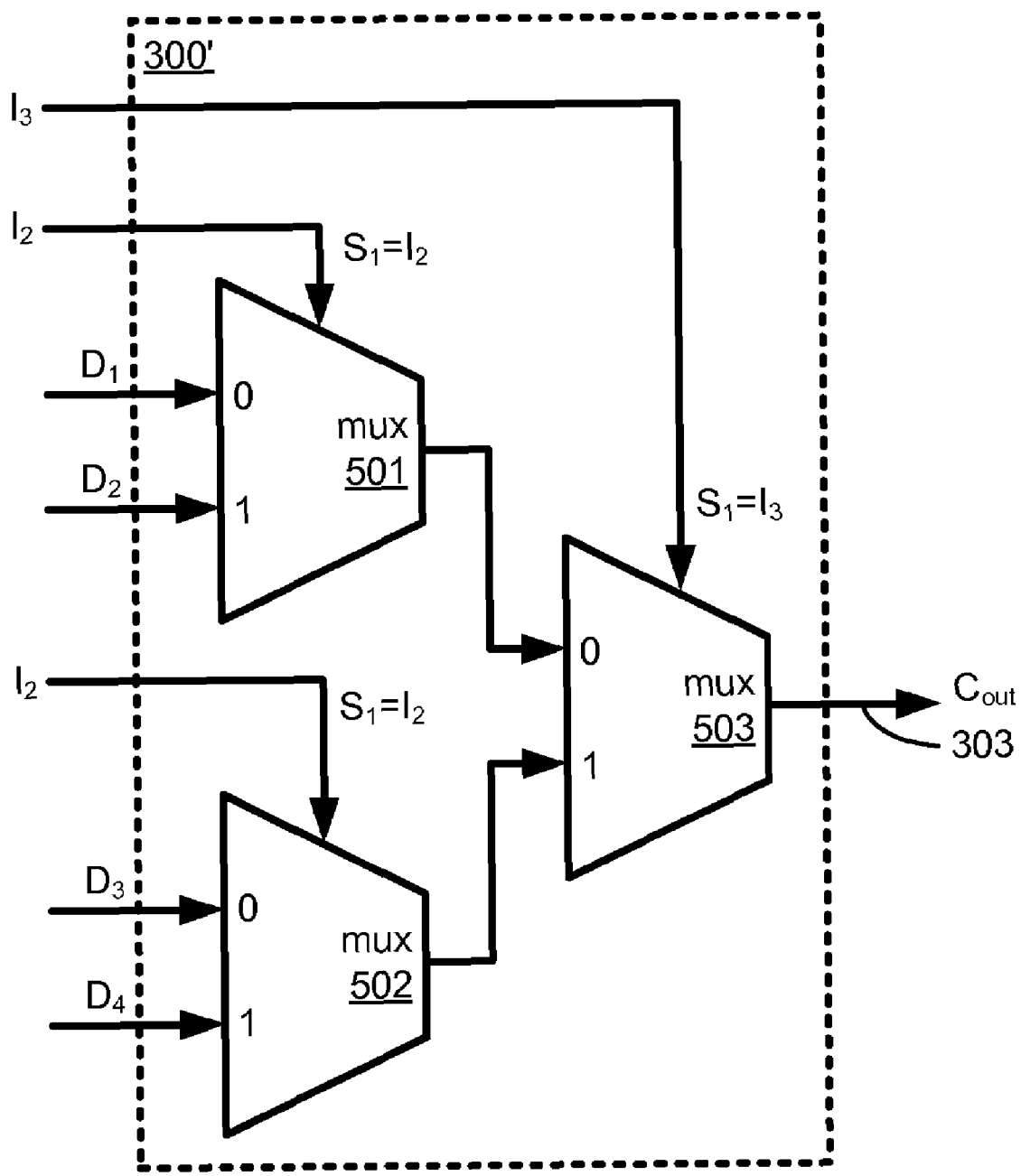
FIG. 11 shows a four-data input port multiplexer constructed from three two-data input multiplexers, in accordance with an embodiment of the present invention.

FIG. 11 shows a four-data input port multiplexer 300' constructed from three two-data input multiplexers 501, 502, 503 arranged in a tree formation, in accordance with an embodiment of the present invention. For example, the functionality of four-input mux 300 of FIG. 10D may be formed with three two-input multiplexers. A first mux 501 of the three multiplexers includes two data input ports for signals $D_1$ and $D_2$ and a selection input $S_1$ for signal $I_2$. A second mux 502 includes two data input ports for signals $D_3$ and $D_3$ and a selection input $S_1$ for signal $I_2$. A third mux 503 includes two data input ports for signals accepting the output signals of mux 501 and 502 and a selection input $S_1$ for signal $I_3$. Each of the settable input signals $D_1$, $D_2$, $D_3$ and $D_4$ provides an independent one of signals '0', '1', $I_1$ and $\overline{I_1}$ to respective muxes 501 and 502 as shown. An output signal $C_{out}$ at port 303 is provided by mux 503.

In accordance with some embodiments of the present invention, the above described circuitry may be included in a macrocell 102. Macrocell 102 may include a two-input multiplexer 300 (as shown in FIGS. 6A, 10A, 10B and 10C), a four-input multiplexer 300 (as shown in FIGS. 10D and 11), or an m-input multiplexer 300 (as shown in FIG. 7A), where m equals, 2, 4, 8, 16, 32, etc.

Figure 12:
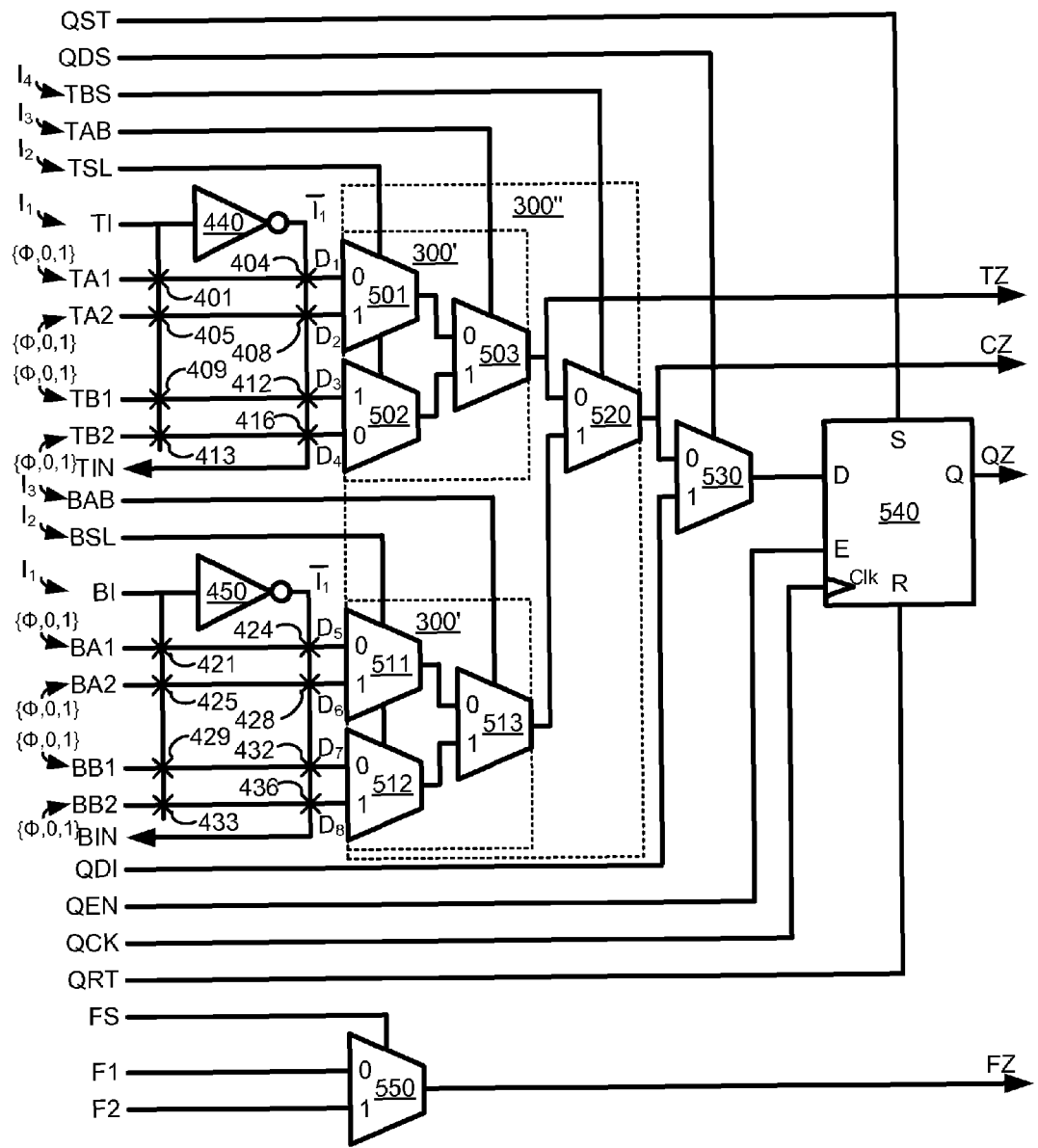
FIG. 12 shows circuitry contained in a macrocell of a programmable device, in accordance with an embodiment of the present invention.

FIG. 12 shows circuitry contained in a macrocell 102 of programmable device 100, in accordance with an embodiment of the present invention. The figure shows several switches (e.g., antifuse switches) 401, 404, 405, 408, 409, 412, 413, 416, 421, 424, 425, 428, 429, 432, 433, and 436, inverters 440, 450, and several two-input multiplexers (501, 502, 503, 511, 512, 513, 520) that may be configured to form one or two two-input multiplexers (501 and 511), one or two four-input multiplexers (300'), and an eight-input multiplexer (300"). The two-input multiplexers (501 and 511) may each emulate the functionality of a four-input multiplexer 200 with four predetermined selectable values $A_1$ to $A_4$. The two four-input multiplexers (300') may each emulate the functionality of an eight-input multiplexer 200 with eight predetermined selectable values $A_1$ to $A_8$. The eight-input multiplexer (300") may emulate the functionality of a 16-input multiplexer 200 with 16 predetermined selectable values $A_1$ to $A_{16}$.

The figure shows external input terminals labeled QST (register set), QDS (register data select), TBS (top/bottom mux select), TAB (top A/B select), TSL (top select), TI (top inverter), TA1 (top mux A input 1), TA2 (top mux A input 2), TB1 (top mux B input 1), TB2 (top mux B input 2), BAB (bottom A/B select), BSL (bottom select), BI (bottom inverter), BA1 (bottom mux A input 1), BA2 (bottom mux A input 2), BB1 (bottom mux B input 1), BB2 (bottom mux B input 2), QDI (register direct input), QEN (register output enable), QCK (register clock), QRT (register reset), FS (function select), F1 (function input 1), F2 (function input 2). The figure shows external output terminals labeled TIN (top inverted signal), BIN (bottom inverted signal), TZ (top output), CZ (center output), QZ (register output) and FZ (function output).

The first of two similar two-input multiplexer includes mux 501 and uses switches 401, 404, 405, and 408, and inverter 440, along with external input terminals TI, TA1, TA2 and TSL. When configured for a particular set of predetermined values $A_1$, $A_2$, $A_3$ and $A_4$, TI may be externally coupled to $I_1$, TA1 may be unconnected (i.e., not externally driven and shown schematically as φ) or externally coupled to one of '0' or '1', TA2 may be unconnected or externally coupled to one of '0' or '1', and TSL may be externally coupled to $I_2$. Output signal TZ is supplied by a tap placed on the line between the output port of mux 503 and an input port of mux 520. Thus, terminal TZ provides a signal that may bypass mux 520, mux 530 and register 540. To provide an output signal at TZ, TAB may be externally coupled to '0'.

The second of two similar two-input multiplexer includes mux 511 and uses switches 421, 424, 425, and 428, and inverter 450, along with external input terminals BI, BA1, BA2 and BSL. When configured for a new particular set of predetermined values $A_1$, $A_2$, $A_3$ and $A_4$, BI may be externally coupled to $I_1$ or a similar signal, BA1 may be unconnected or externally coupled to one of '0' or '1', BA2 may be unconnected or externally coupled to one of '0' or '1', and BSL may be externally coupled to $I_2$ or a similar signal. Output signal CZ is supplied by a tap placed on the line between the output port of mux 520 and an input port of mux 530. Thus, terminal CZ provides a signal that may bypass mux 530 and register 540. To provide an output signal at CZ, BAB may be externally coupled to '0' and TBS may be externally coupled to '1'.

An additional independent two-input multiplexer may be formed with the addition of a tap (not shown) between multiplexers 501 and 503 or between multiplexers 502 and 503. Similarly, an additional independent two-input multiplexer may be formed with the addition of a tap (not shown) between multiplexers 511 and 513 or between multiplexers 512 and 513.

The first of two similar four-input multiplexer (300') includes muxes 501, 502 and 503 and is configured in a tree formation as described above with reference to FIG. 11. Macrocell 102 couples an external port TA1 to input port $D_1$, an external port TA2 to input port $D_2$, an external port TB1 to input port $D_3$, an external port TB2 to input port $D_4$. Macrocell 102 also includes an inverter 440 with an input coupled to an external terminal TI. Inverter 440 generates a complement signal at its output port. For example, the programmable device may be configured to supply a first select signal $I_1$ to terminal TI. Inverter 440 then provides $\overline{I_1}$ at its output port. Additionally, input terminal TSL may be coupled to signal $I_2$ and input terminal TAB may be coupled to signal $I_3$. By appropriately defining and setting data input ports $D_1$, $D_2$, $D_3$ and $D_4$, the four-input multiplexer can imitate an eight-input conventional mux 200 having predetermined inputs $A_1$, $A_2$, $A_3$, $A_4$, $A_5$, $A_6$, $A_7$ and $A_8$.

Macrocell 102 may also include switches (e.g., antifuses) 401, 405, 409 and 413, which may conduct an input signal at terminal TI (e.g., signal $I_1$) to mux input ports $D_1$, $D_2$, $D_3$ and $D_4$, respectively. Each respective terminal TA1, TA2, TB1 and TB2 may be left unconnected when a respective switch 401, 405, 409 or 413 is in a conducting state. Alternatively, a signal provided at terminal TI (e.g., signal $I_1$) may be supplied directly to terminal TA1, TA2, TB1 or TB2.

Macrocell 102 may also include switches (e.g., antifuses) 404, 408, 412 and 416, which may conduct a complement of the input signal at terminal TI (e.g., $\overline{I_1}$) to mux input ports $D_1$, $D_2$, $D_3$ and $D_4$, respectively. Again, each respective terminal TA1, TA2, TB1 and TB2 may be left unconnected to an external input signal when a respective switch 404, 408, 412 and 416 is in a conducting state. That is, the respective terminal may be left un-driven from external circuitry because it is driven internally from a signal passing through a switch connection. Alternatively, the complement signal (e.g., $\overline{I_1}$) may be supplied directly to terminal TA1, TA2, TB1 or TB2. In addition, input terminals TA1, TA2, TB1 or TB2 may be coupled to either a logical low value ('0') or a logical high value ('1').

A second four-input multiplexer (300') is shown arranged in parallel to the first four-input multiplexer. For clarity for m data input ports for a mux 300 arranged in parallel to another mux 300, data input signals labeled as $D_5$, . . . , $D_8$ may be denoted as $DD_1$, . . . , $DD_m$. Similarly, the corresponding n select input signals may be denoted $SS_1$, . . . , $SS_n$. The second four-input multiplexer includes muxes 511, 512 and 513, which are also configured in a tree formation as described above. The second four-input multiplexer may similarly use switch logic including a set of switches 421, 424, 425, 428, 429, 432, 433 and 436, an inverter 450, input terminals BI, BA1, BA2, BB1 and BB2, and output terminal BIN. Input terminal BI may be coupled to $I_1$ or similar signal. Input terminal BSL may be coupled to $I_2$ or similar signal. Input terminal BAB may be coupled to $I_3$ or similar signal. Input terminals BA1, BA2, BB1 and BB2 may each be separately coupled to a respective one of a logical low or a logical high, or left uncoupled. Alternatively, input terminals BA1, BA2, BB1 and BB2 may each be separately coupled to a respective one of a logical low, a logical high or a select signal $I_1$ or similar signal, or left uncoupled. Alternatively, input terminals BA1, BA2, BB1 and BB2 may each be separately coupled to a respective one of a logical low, a logical high, a select signal $I_1$ or similar signal, or it complement signal.

An eight-input multiplexer 300'' may be formed with the first and second four-input multiplexer described above along with mux 520 and another select signal (e.g., $I_4$) at terminal TBS, where signal $I_2$ is provided at both TSL and BSL and signal $I_3$ is provided at both TAB and BAB. Depending on the predetermined values $A_1$, $A_2$, $A_3$, $A_4$, $A_5$, $A_6$, $A_7$, $A_8$, $A_9$, $A_{10}$, $A_{11}$, $A_{12}$, $A_{13}$, $A_{14}$, $A_{15}$ and $A_{16}$ that are to be emulated, switches within the macrocell and/or separate from the macrocell are programmed such that appropriate values are provided as data input signals $D_1$, $D_2$, $D_3$, $D_4$, $D_5$, $D_6$, $D_7$ and $D_8$ to the eight-input multiplexer.

Optional switches 401, 405, 409 and 413 may be included internally to in macrocell 102 to provide the first selection signal $I_1$ to respective inputs $D_1$, $D_2$, $D_3$ and $D_4$ of muxes 501 and 502 as shown. Alternatively, the first selection signal $I_1$ may be switched to respective mux data input ports with switches located externally from macrocell 102 (not shown). Optional inverters 440 and 450 may be used to generate the complement signal $\overline{I_1}$ within macrocell 102. Alternatively, inverters may be located separate from the macrocell, thus providing the complement signal $\overline{I_1}$ to an input port of the macrocell, such as via input port TA1 or TA2 for respective inputs $D_1$ or $D_2$ of mux 501.

Optional circuitry may also be included in macrocell 102 to add additional functionality and flexibility. For example, a mux 530 may provide either the output signal to the multiplexer tree or may provide a bypass signal (QDI) based on selection signal QDS. Also, a memory element such as a latch or register may be added to hold the output signal from the multiplexer tree. For example, delay-type flip-flop (D-FF) (not shown) may be used hold the output data. Alternatively, a set-reset (R-S) register 540 may be used to register the output signal from the multiplexer tree. The output signal of the multiplexer tree (CZ) may be coupled to a data input port (D) of register 540 and register 540 may forward this input data to an output data port (Q) when it receives a clock signal (QCK). The output (Q) of the register may be provided by macrocell 102 at an output port (QZ). The register may also include additional controls such as an enable bit (E) coupled to an external enable control line (QEN), a set bit (S) coupled to an external set control line (QST), and/or a reset bit (R) coupled to an external reset control line (QRT). Furthermore, macrocell 102 may contain an extra multiplexer 550 uncoupled within macrocell 102. Extra multiplexer 550 may be a distinct multiplexer (uncoupled within macrocell 102) to the multiplexer(s) formed with multiplexers 501-503, 511-513, 520 and/or 530. Mux 550 may have two data inputs coupled to two respective input terminals (F1 and F2), a selection input coupled to a select line (FS), and an output coupled to an output port (FZ).

According to some embodiments of the present invention, a method is provided for configuring a programmable logic device, such as an pASIC or an FPGA, where the programmable logic device emulates a conventional multiplexer 200 having j input ports accepting respective predetermined fixed logical values $A_1, A_2, A_3, \ldots, A_j$ and also having k select ports for coupling to k variable signals $I_1, \ldots, I_k$, where $j=2^k$. The method comprises first determining the fixed logical values $A_1, A_2, A_3, \ldots, A_j$. Based on the determined fixed logical values $A_1, A_2, A_3, \ldots, A_j$, determining or selecting values to which to set the data input signals $D_1, \ldots, D_m$ for a m-data input mux 300 having n select ports, where m=j/2. One signal selected from (1) a logical low, (2) the logical high, (3) a first variable signal $I_1$ and (4) a complement of the first variable signal ($\overline{I_1}$) is assigned to each data input signal $D_1, \ldots, D_m$. Based on the determined data input signals $D_1, \ldots, D_m$, a switch configuration may be determined. Based on this determined switch configuration, one or more switches coupled to the input ports 301 may be programmed to conduct, or not conduct. The programmed switches then have conductive states for coupling the selected signals ('0', '1', $I_1$ or $\overline{I_1}$) for each of the corresponding input ports 301 to mux 300.

In addition, one or more switches may be programmed to couple the variable signals $I_2, \ldots, I_k$ to n respective select input ports $S_1, \ldots, S_n$ of the m-data input multiplexer. Applying variable signals $I_2, \ldots, I_k$ to select input ports $S_1, \ldots, S_n$ and applying configurable data input signals $D_1, \ldots, D_m$ to the m-data input ports of mux 300 results in the desired output values $A_1, A_2, A_3, \ldots, A_j$. Data input signals $D_1, \ldots, D_m$ are configurable to receive any of signals '0', '1', $I_1$ and $\overline{I_1}$. This output signal may be provided to and held in a register, e.g., by applying a clock signal to the register to hold the output value at an output of the register. In some embodiments, mux 300 has parameters n=1 and m=2, thus emulating a conventional mux 200 with parameters k=2 and j=4. In other embodiments, mux 300 has parameters n=2 and m=4, thus emulating a conventional mux 200 with parameters k=3 and j=8. In other embodiments, mux 300 has parameters n=3 and m=8, thus emulating a conventional mux 200 with parameters k=4 and j=16.

The description above provides various hardware embodiments of the present invention. Furthermore, the figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention can be practiced with modification and alteration within the spirit and scope of the claims. The description is not intended to be exhaustive or to limit the invention to the precise form disclosed. It should be understood that the invention can be practiced with modification and alteration.

What is claimed is:

1. A method for configuring a programmable logic device to emulate a conventional multiplexer by using a multiplexer having m input ports, wherein the conventional multiplexer has j input ports accepting respective fixed logical values $A_1$, $A_2, A_3, \ldots, A_j$ and also has k select ports for coupling to k variable signals $I_1, \ldots, I_k$, where m=j/2, the method comprising:

providing the fixed logical values $A_1, A_2, A_3, \ldots, A_j$; and selecting a signal from (1) a logical low, (2) a logical high, (3) the first variable signal $I_1$ and (4) a complement of the first variable signal $\overline{I_1}$, based on the fixed logical values $A_1, A_2, A_3, \ldots, A_j$, for each of m signals $D_1, \ldots, D_m$.

2. The method of claim 1, further comprising programming a plurality of switches for providing the m selected signals $D_1, \ldots, D_m$ to the m input ports of the multiplexer.

3. The method of claim 1, further comprising programming one or more switches for coupling the k−1 variable signals $I_2, \ldots, I_k$ to n corresponding select input ports $S_1, \ldots, S_n$ of the m data input multiplexer, where n=k−1.

4. The method of claim 1, further comprising applying the variable signals $I_1, \ldots, I_k$ in the programmable logic device.

5. The method of claim 1, further comprising:

coupling an output signal of the multiplexer to an input port of a register; and applying a clock signal to the register to hold the output signal at an output port of the register.

6. The method of claim 1, wherein k=2, j=4 and m=2.

7. The method of claim 1, wherein k=3, j=8 and m=4.

8. The method of claim 1, wherein k=4, j=16 and m=8.

* * * * *